US008030170B2

(12) United States Patent
Ho et al.

(10) Patent No.: US 8,030,170 B2
(45) Date of Patent: Oct. 4, 2011

(54) METHODS OF FORMING ISOLATION STRUCTURES, AND METHODS OF FORMING NONVOLATILE MEMORY

(75) Inventors: Yunjun Ho, Boise, ID (US); Matt Meyers, Boise, ID (US); Kevin L. Beaman, Boise, ID (US); Gregory J. Light, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 50 days.

(21) Appl. No.: 12/633,694

(22) Filed: Dec. 8, 2009

(65) Prior Publication Data

US 2011/0136319 A1 Jun. 9, 2011

(51) Int. Cl.
*H01L 21/76* (2006.01)
(52) U.S. Cl. .................. 438/424; 257/E21.54
(58) Field of Classification Search .................. 438/424, 438/430, 431; 257/E21.54, E21.546
See application file for complete search history.

(56) References Cited

U.S. PATENT DOCUMENTS

| 7,271,463 B2 | 9/2007 | Smythe, III et al. |
| 7,273,796 B2 | 9/2007 | Smythe et al. |
| 7,514,366 B2 | 4/2009 | Trivedi et al. |
| 7,521,378 B2 | 4/2009 | Fucsko et al. |
| 2004/0185617 A1* | 9/2004 | Shukuri ................ 438/257 |
| 2006/0035450 A1* | 2/2006 | Frank et al. ........... 438/585 |
| 2007/0298583 A1* | 12/2007 | Wu et al. ............... 438/424 |
| 2008/0064212 A1* | 3/2008 | Ogawa et al. ......... 438/694 |
| 2009/0035917 A1 | 2/2009 | Ahn et al. |

* cited by examiner

*Primary Examiner* — Quoc Hoang
(74) *Attorney, Agent, or Firm* — Wells St. John P.S.

(57) ABSTRACT

Some embodiments include methods of forming isolation structures. A trench may be formed to extend into a semiconductor material. Polysilazane may be formed within the trench, and then exposed to steam. A maximum temperature of the polysilazane during the steam exposure may be less than or equal to about 500° C. The steam exposure may convert all of the polysilazane to silicon oxide. The silicon oxide may be annealed under an inert atmosphere. A maximum temperature of the silicon oxide during the annealing may be from about 700° C. to about 1000° C. In some embodiments, the isolation structures are utilized to isolate nonvolatile memory components from one another.

16 Claims, 13 Drawing Sheets

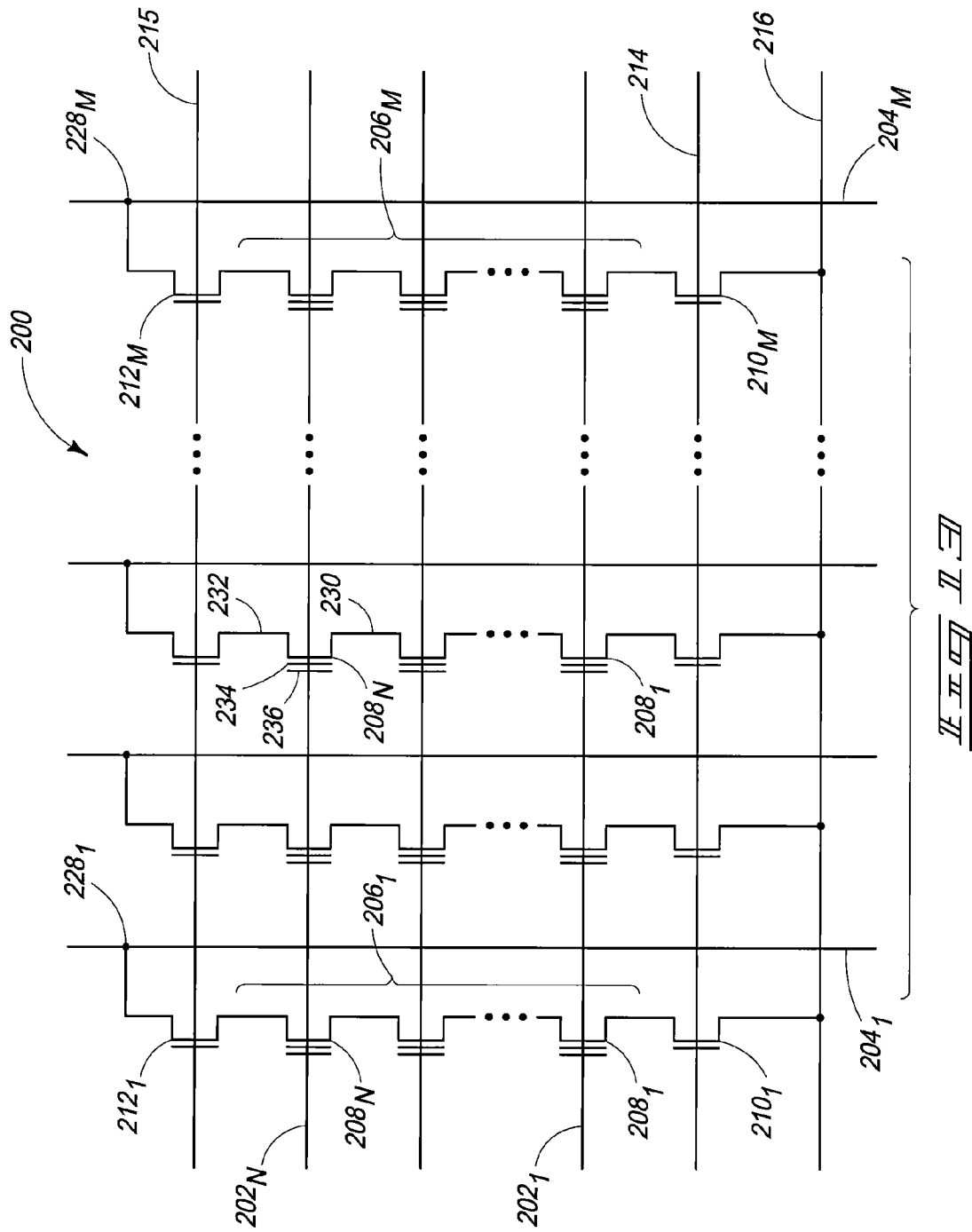

METHODS OF FORMING ISOLATION STRUCTURES, AND METHODS OF FORMING NONVOLATILE MEMORY

TECHNICAL FIELD

Methods of forming isolation structures, and methods of forming nonvolatile memory.

BACKGROUND

The fabrication of semiconductor-based circuitry comprises formation of highly integrated electrical components (with example electrical components being transistors, resistors and capacitors), and thus comprises forming electrical components in close proximity to each other. Insulative materials may be used to electrically isolate various electrical components from one another.

One method of electrically isolating adjacent electrical components from one another is to use trench isolation. Trench isolation may be formed by creating trenches in a semiconductor material, and then filling the trenches with insulative material.

One type of insulative material that may be used to fill the trenches is silicon oxide formed from spin-on dielectric (SOD). Example SODs are polysilazanes. When polysilazanes are utilized as SODs, the formation of silicon oxide may comprise multiple steps. Initially, spin-on methodology may be used to fill trenches with polysilazane. Subsequently, the polysilazane within the trenches may be converted to silicon oxide by exposing the polysilazane to oxidant and appropriate thermal conditions.

A common method for converting a polysilazane to silicon oxide is to use steam densification. Specifically, the polysilazane is exposed to steam while being maintained at a temperature of at least 585° C.

A problem with such steam densification is that oxidant can penetrate through the polysilazane and into semiconductor material adjacent the polysilazane. Thus, it is common to provide a silicon nitride liner within the trenches prior to filling the trenches with polysilazane. The silicon nitride liner can function as a barrier during steam densification of the polysilazane, with such barrier protecting underlying semiconductor material from oxidation during the steam densification.

In some applications it would be desirable to utilize SODs, but to omit the silicon nitride barriers. Accordingly, it would be desirable to develop new methods for utilizing SODs during fabrication of isolation structures.

BRIEF DESCRIPTION OF THE DRAWINGS

FIG. 13 is a schematic diagram of a nonvolatile memory array in accordance with an embodiment.

DETAILED DESCRIPTION OF THE ILLUSTRATED EMBODIMENTS

In some embodiments, the invention includes new methods for converting polysilazane into silicon oxide. The new methods may include steam treatment at a relatively low temperature (for instance, under conditions in which the temperature of the polysilazane does not exceed 500° C.), for a relatively long time (for instance, for time of from about two hours to about 10 hours) to convert the polysilazane to silicon oxide; followed by an anneal of the silicon oxide under an inert ambient to a maximum temperature of at least about 700° C. to densify the silicon oxide. The low-temperature steam treatment and subsequent anneal may be mild enough to allow silicon nitride barrier layers of the prior art to be omitted, and yet may form silicon dioxide suitable for electrically isolating integrated circuit devices from one another.

The omission of the silicon nitride layers that may be accomplished utilizing methodology of the present invention can be particularly advantageous for applications containing nonvolatile memory cells (for instance, NAND applications). Specifically, the silicon nitride barrier layers of prior art trench isolation structures can problematically degrade nonvolatile memory device performance through the charge-trapping characteristics that are inherent in silicon nitride. Methodology of the present invention may be used to eliminate the silicon nitride barrier layers of prior art trench isolation structures, and thus can avoid problems associated with the inherent charge-trapping characteristics of such silicon nitride barrier layers.

Example methods of the present invention is described with reference to FIGS. 1-11.

Figure 1:
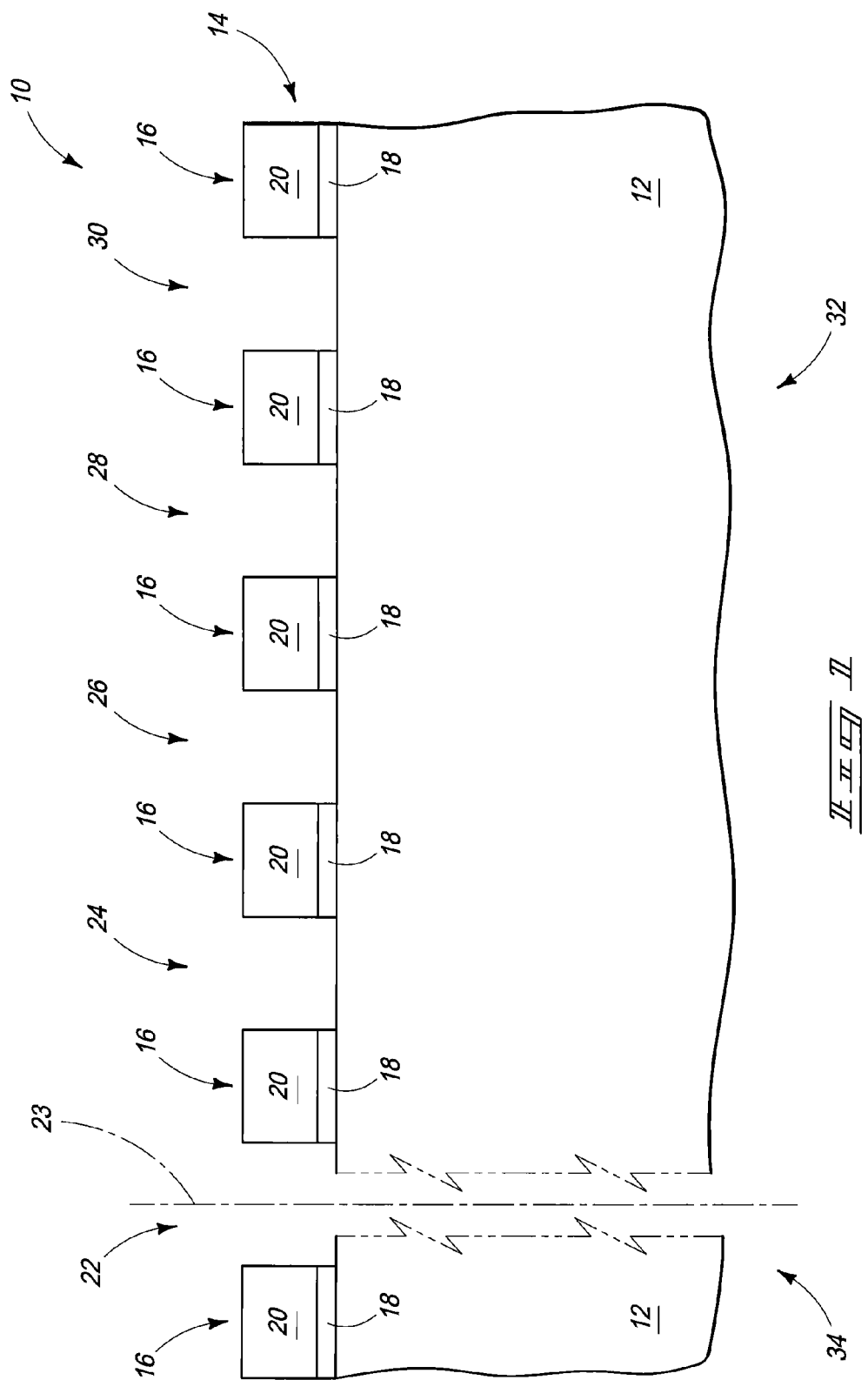
FIGS. 1-7 are diagrammatic cross-sectional views of a portion of a semiconductor construction at various steps of an example embodiment method.

Referring to FIG. 1, such shows a portion of a semiconductor construction 10. The semiconductor construction includes a semiconductor material 12 having a patterned mask 14 thereover.

Semiconductor material 12 may, for example, comprise, consist essentially of, or consist of monocrystalline silicon lightly background-doped with appropriate p-type dopant. In some embodiments, the semiconductor material 12 may be referred to as a semiconductor substrate. The terms "semiconductive substrate" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" means any supporting structure, including, but not limited to, the semiconductive substrates described above. In some embodiments, semiconductor material 12 may be considered to correspond to a semiconductor substrate ultimately utilized to support integrated circuitry.

Patterned mask 14 comprises a plurality of spaced apart features 16, with each of the features having a layer 20 supported over a layer 18. In some embodiments, layers 20 and 18 may be floating gate material and tunnel dielectric material, respectively. In such embodiments, layer 20 may comprise, consist essentially of, or consist of silicon (for instance, polysilicon); and layer 18 may comprise, consist essentially of, or consist of silicon dioxide. In some embodiments, layers 20 and 18 may be a hard mask and a pad layer, respectively. In such embodiments, layer 20 may comprise, consist essentially of, or consist of silicon nitride; and layer 18 may comprise, consist essentially of, or consist of silicon dioxide.

Layers 18 and 20 may be formed into the shown pattern of mask 14 by initially forming layers 18 and 20 entirely across an upper surface of semiconductor material 12, utilizing a photolithographically-patterned photoresist mask (not shown) to define the pattern that is to be formed into layers 18 and 20, utilizing etching to transfer the pattern from the photoresist mask into layers 18 and 20, and then removing the photoresist mask to leave the construction of FIG. 1.

The patterned mask 14 has a plurality of openings 22, 24, 26, 28 and 30 extending therethrough. The openings 24, 26, 28 and 30 are all about the same width as one another in the shown cross-section. In contrast, the width of opening 22 is larger than the widths of openings 24, 26, 28 and 30. In some embodiments, opening 22 may define a boundary between a memory array region and another region peripheral to the memory array region. A dashed line 23 is provided to diagrammatically delineate a boundary between the memory array region and the peripheral region; and specifically is shown delineating a boundary between a memory array region 32 on the right side of the dashed line, and a peripheral region 34 on the left side of the dashed line.

Figure 2:
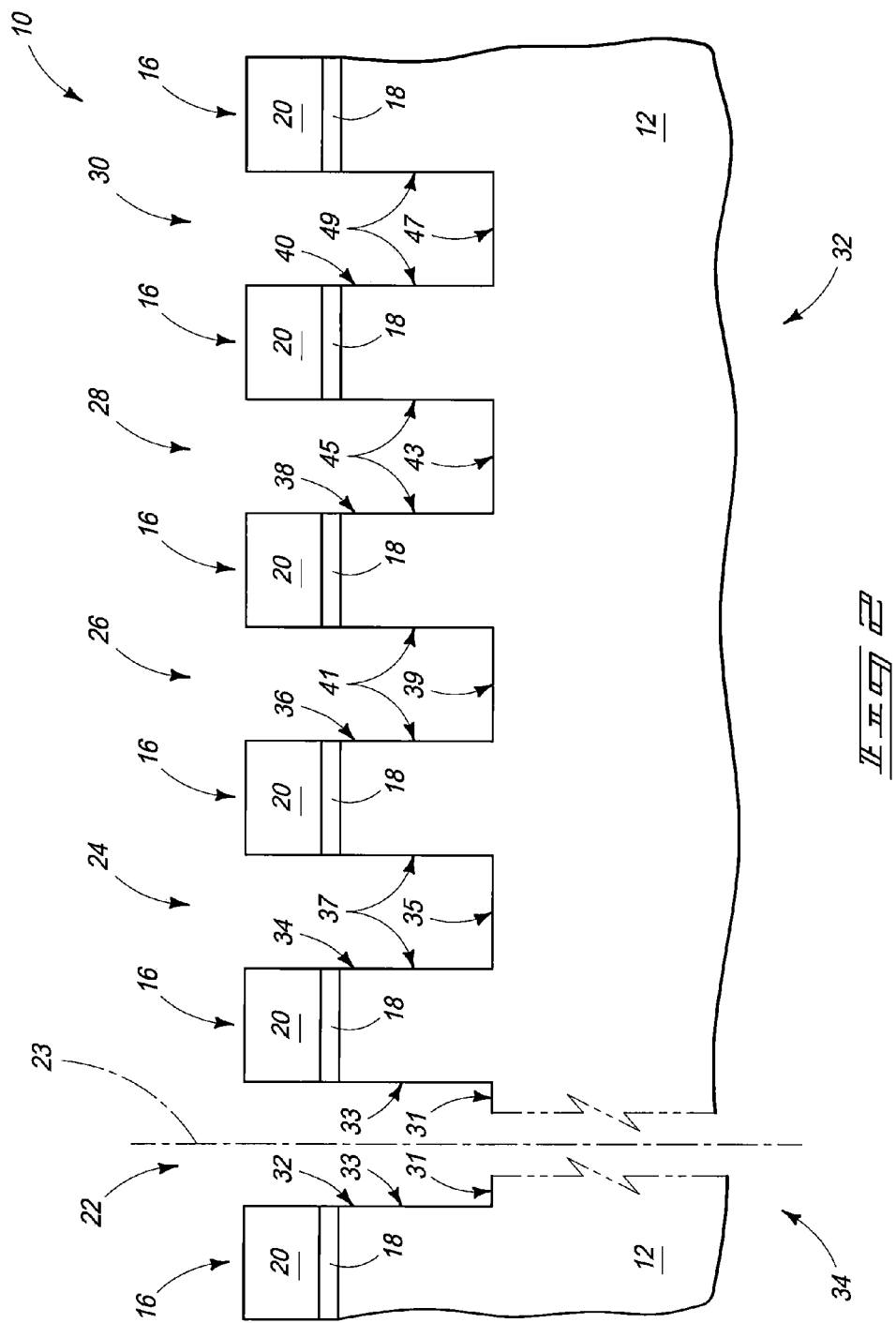

Referring to FIG. 2, openings 22, 24, 26, 28 and 30 are extended into semiconductor material 12 with an etch selective for material 12 relative to materials 18 and 20. Each of the openings 22, 24, 26, 28 and 30 within semiconductor material 12 has a periphery. Specifically, opening 22 has a periphery 32 comprising a bottom 31 and a pair sidewalls 33; opening 24 has a periphery 34 comprising a bottom 35 and sidewalls 37; opening 26 has a periphery 34 comprising a bottom 39 and sidewalls 41; opening 28 has a periphery 38 comprising a bottom 43 and sidewalls 45; and opening 30 has a periphery 40 comprising a bottom 47 and sidewalls 49. The bottoms and sidewalls of the peripheries correspond to semiconductor material 12, and accordingly in some embodiments may consist of monocrystalline silicon.

In some embodiments, the openings 22, 24, 26, 28 and 30 may correspond to trenches that extend in and out of the page relative to the cross-section of FIG. 2.

Figure 3:
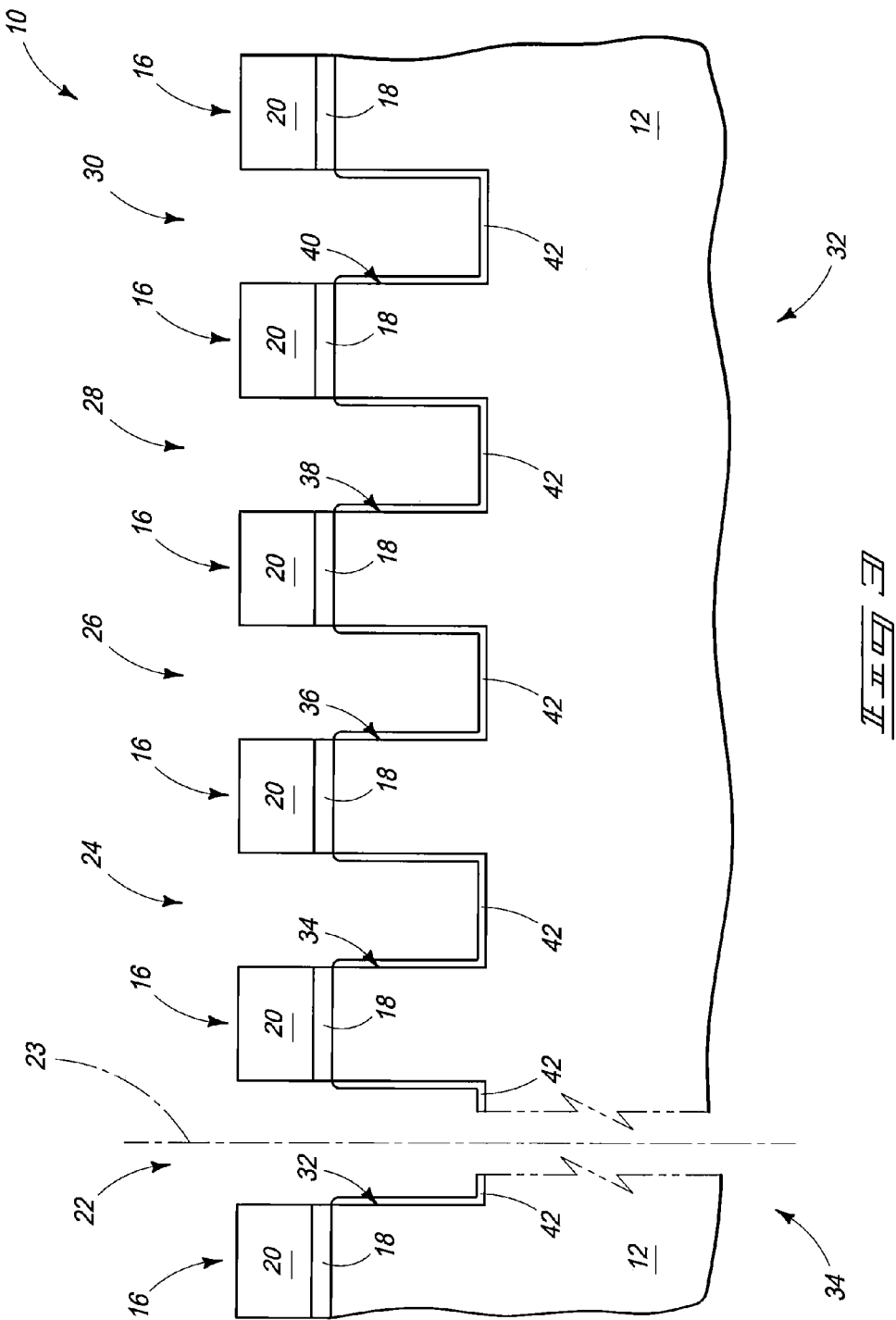

Referring to FIG. 3, oxide liners 42 are formed along the peripheries 32, 34, 36, 38 and 40 of the openings 22, 24, 26, 28 and 30, respectively. The oxide liners may be formed by utilizing an oxidant to oxidize the semiconductor material 12 exposed within the openings; and in some embodiments may correspond to so-called "native oxide" formed by exposing semiconductor material 12 to $O_2$. In embodiments in which semiconductor material 12 consists of silicon, the oxide liners may consist of silicon dioxide. The oxide liners 42 are optional, and accordingly may be omitted in some embodiments.

Although the oxide liners 42 are shown formed only along semiconductor material 12, in other embodiments the oxidation conditions utilized to form the oxide liners may be sufficient to oxidize surfaces of layer 20.

Figure 4:
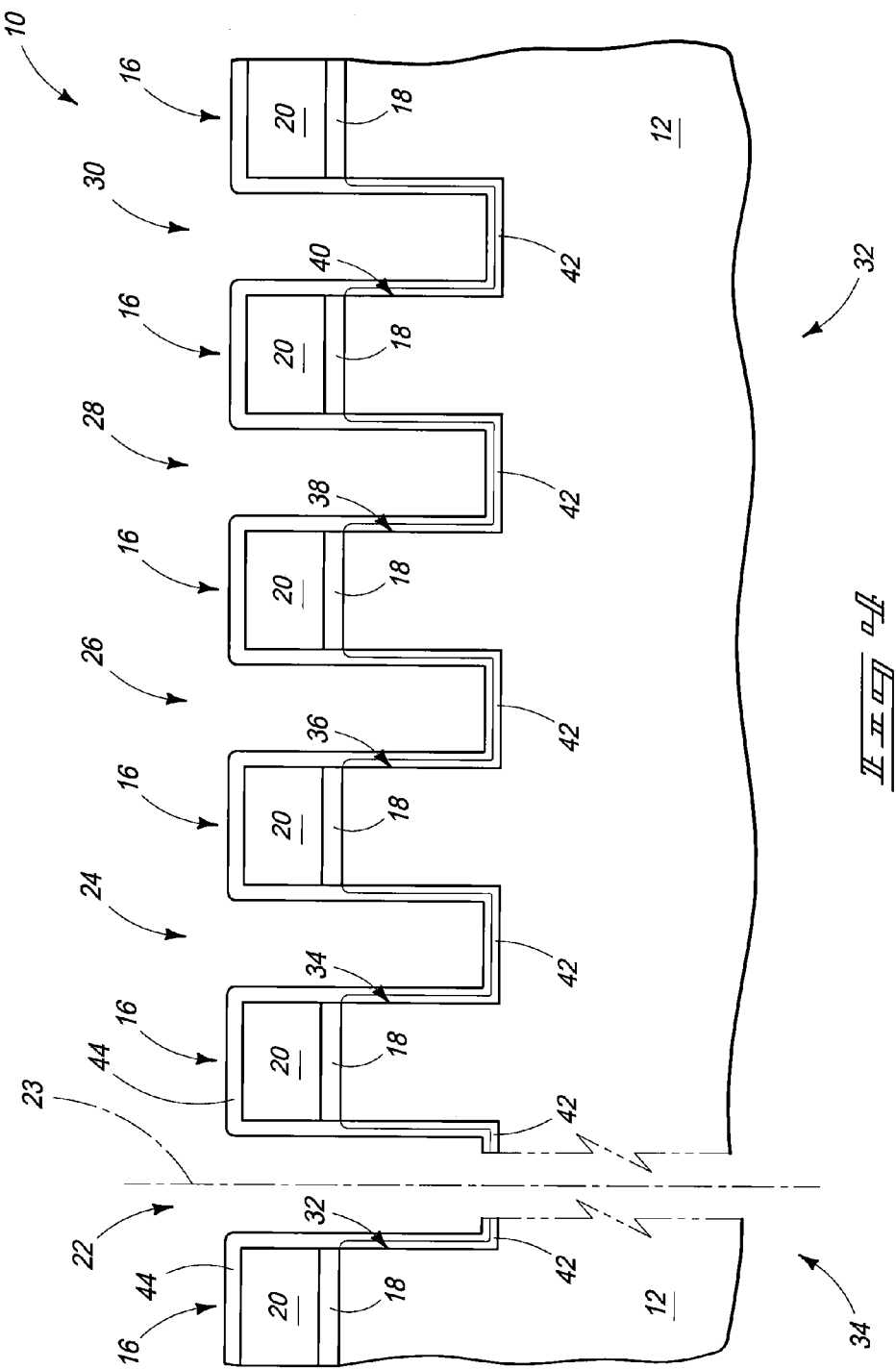

Referring to FIG. 4, a layer of oxide 44 is deposited across construction 10 and within openings 22, 24, 26, 28 and 30. In some embodiments, layer 44 may correspond to silicon dioxide deposited utilizing tetraethylorthosilicate (TEOS). Oxide 44 is optional, and accordingly may be omitted in some embodiments. Also, although oxide 44 is shown formed after oxide 42, in other embodiments oxide 44 may first be deposited, and then oxidation conditions may be chosen which diffuse oxidant through oxide 44 and thereby oxidize the semiconductor material 12 underlying deposited material 44.

Figure 5:
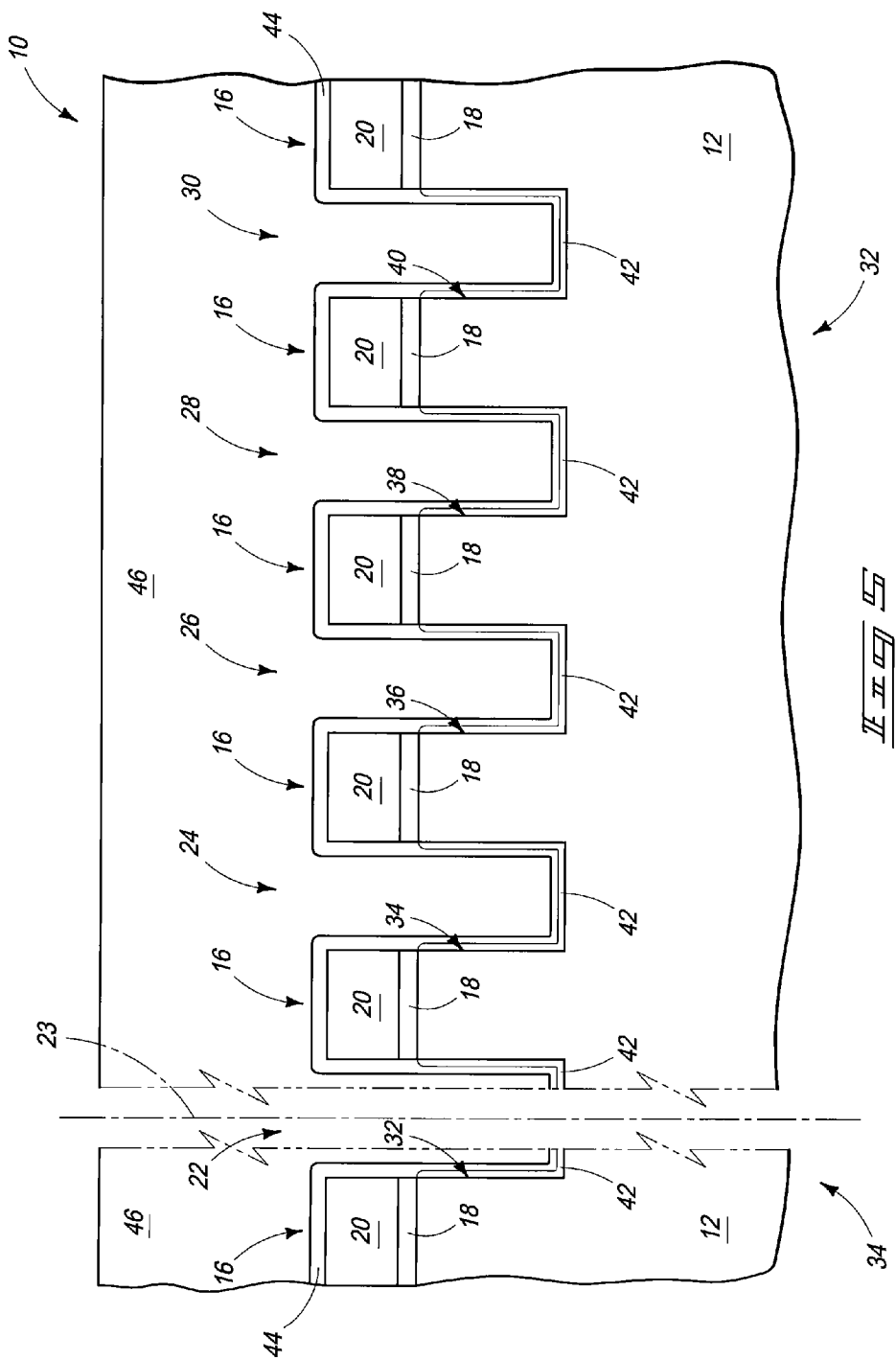

Referring to FIG. 5, polysilazane 46 is deposited over construction 10 and within openings 22, 24, 26, 28 and 30. The polysilazane may correspond to a spin-on dielectric, and accordingly may be deposited utilizing spin-on methodologies. Polysilazanes contain Si, N and H. Example polysilazanes that can be used are hexamethyldisilazane, tetramethyldisilazane, octamethylcyclotetrasilazine, hexamethylcyclotrisilazine, diethylaminotrimethylsilane, dimethylaminotrimethylsilane and perhydro-polysilazane. Perhydro-polysilazane may be preferred in some embodiments.

A notable aspect of FIG. 5 is that there is no silicon nitride barrier layer between polysilazane 46 and the peripheries 32, 34, 36, 38 and 40 of openings 22, 24, 26, 28 and 30. In other words, there is no silicon nitride layer separating the polysilazane within the openings from the semiconductor material 12 along the peripheries of such openings.

Figure 6:
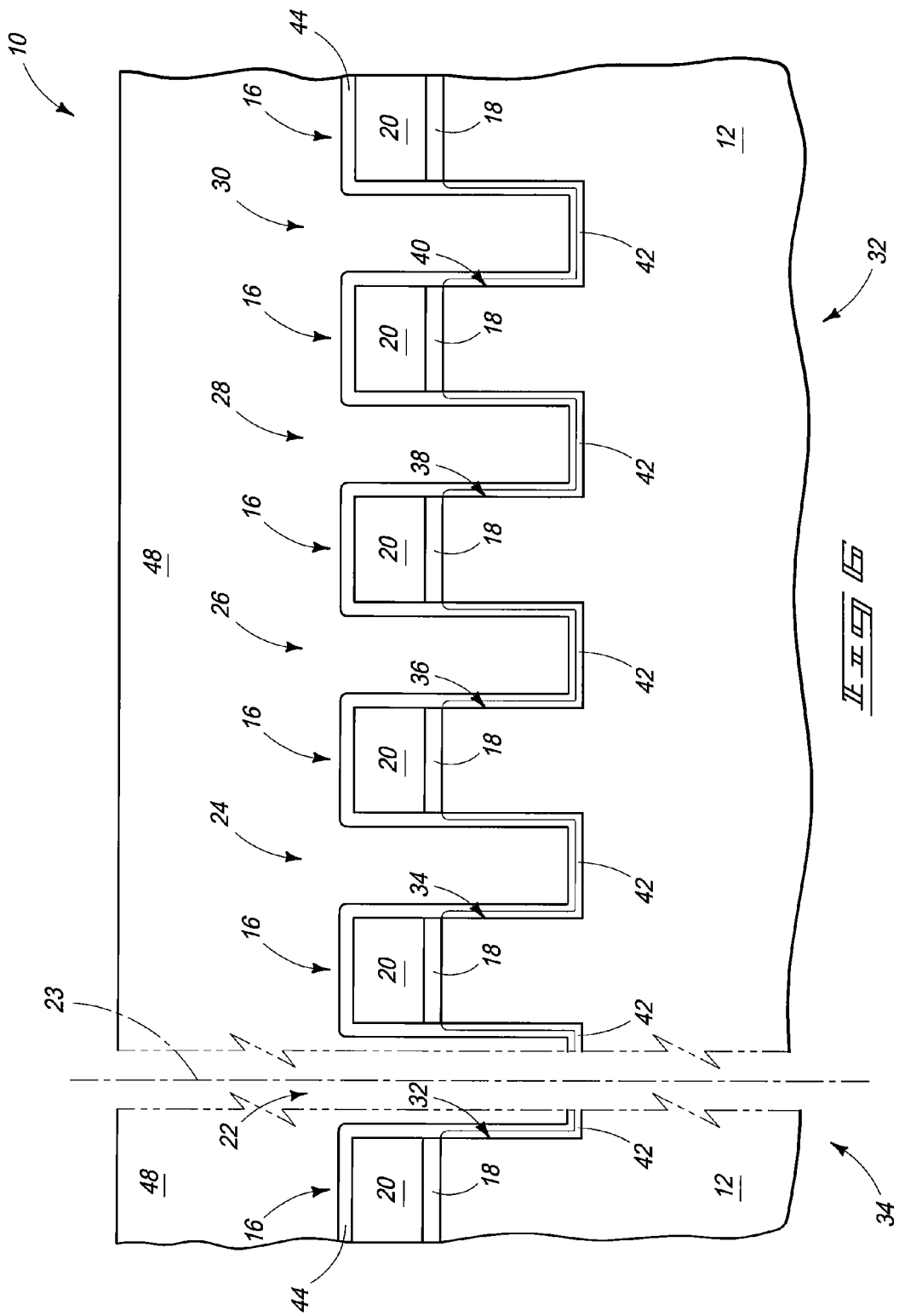

Referring to FIG. 6, polysilazane 46 (FIG. 5) is converted to silicon oxide 48 by exposure of the polysilazane to steam. The silicon oxide has the formula $SiO_x$, where x is greater than zero and less than or equal to 2. The exposure to the steam may comprise subjecting the polysilazane to a maximum temperature that does not exceed 500° C. for a sufficient a duration of time to convert all of the polysilazane to silicon oxide. In some embodiments, the maximum temperature may be within a range of from about 350° C. to about 500° C., and the time duration may be from about two hours to about 10 hours (with longer durations being utilized for lower maximum temperatures). The polysilazane temperature may be increased to the maximum temperature utilizing any suitable temperature gradient. In some embodiments, the temperature gradient may comprise only temperature changes within the polysilazane (and the rest of construction 10) of less than or equal to 10° C./minute. If the temperature gradient changes a temperature of construction 10 too quickly, defects may be introduced into some regions of the construction. The utilization of a temperature gradient comprising only temperature changes of less than 10° C./minute may eliminate such defects. The polysilazane may be exposed to steam during the time that the temperature is ramped to the maximum temperature, as well as during the time that the temperature is maintained at the maximum temperature.

The exposure of the polysilazane to steam may occur in any suitable reaction chamber, and at any suitable pressure. In some embodiments, the pressure may be approximately atmospheric pressure.

Figure 7:
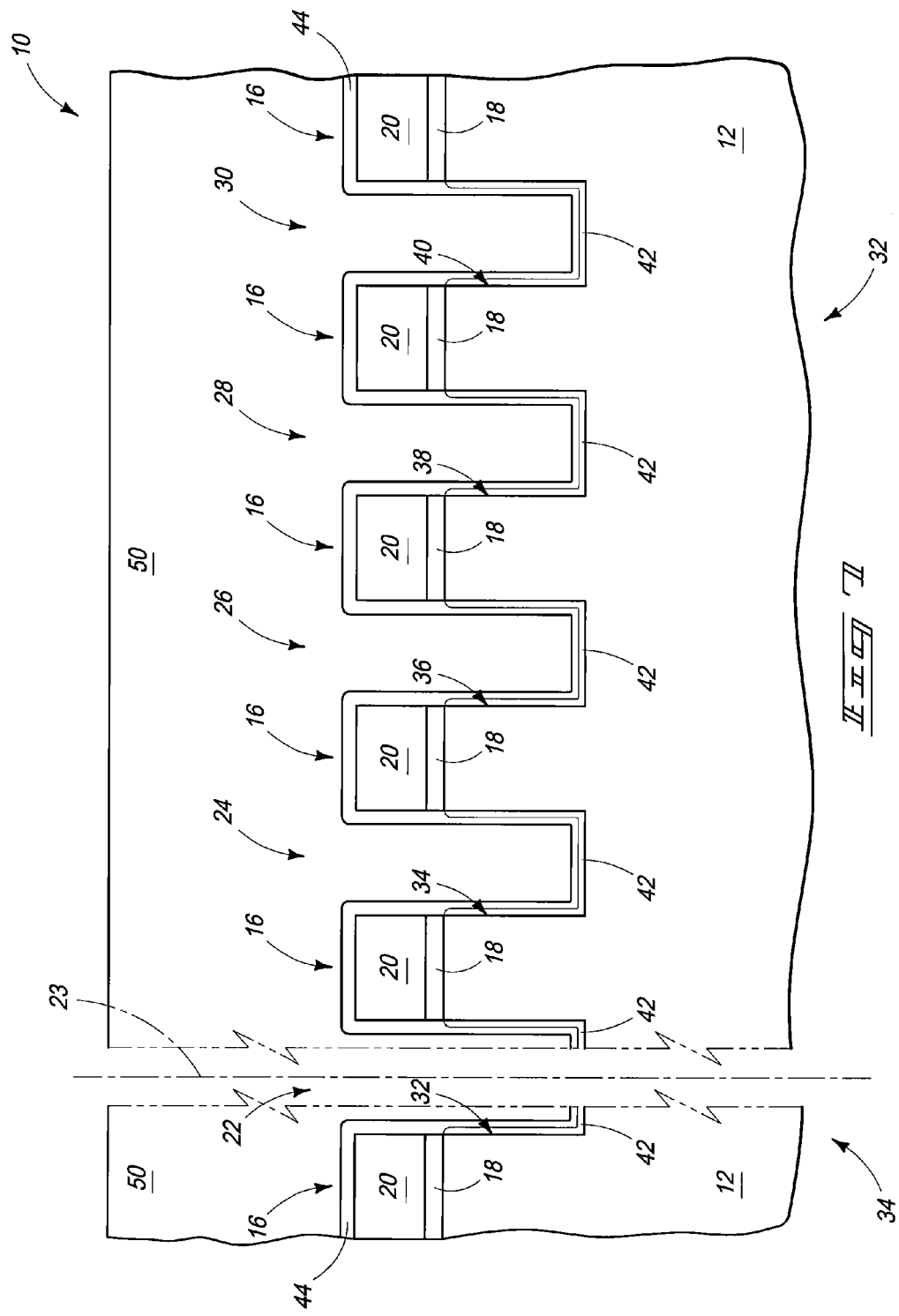

Referring to FIG. 7, the silicon oxide 48 (FIG. 6) is subjected to an anneal to convert such silicon oxide to densified silicon oxide 50. The annealing may be conducted under an inert atmosphere (in other words, while construction 10 is exposed to a gas that is non-reactive with the construction, with suitable gases including one or more of argon, helium and $N_2$). The annealing may utilize a maximum annealing temperature that is at least about 700° C.; and in some embodiments may utilize a maximum annealing temperature that is within a range of from at least 700° C. to less than or equal to about 1000° C. The annealing may be conducted at any suitable pressure, and in some embodiments is conducted at about atmospheric pressure.

The maximum annealing temperature may be held for any suitable duration of time. In some embodiments, the maximum annealing temperature may be held for a time duration that is within a range of from about 1 minute to about two hours. In some embodiments, the annealing may comprise not only the duration that the maximum annealing temperature is held, but also a period of time during which a temperature of construction 10 is ramped up to the maximum annealing temperature, and then ramped back down from the maximum annealing temperature to about room temperature; and the construction may be under the inert atmosphere during the entirety of the time that the construction is being ramped to and from the maximum annealing temperature.

The ramping of the temperature of construction 10 to and from the maximum annealing temperature may comprise a gradient having only temperature changes of less than 10° C./minute, for reasons similar to those discussed above regarding the temperature gradient utilized to ramp construction 10 during the steam treatment.

The annealing of the silicon oxide may occur in the same reaction chamber utilized for the steam treatment of the polysilazane, or may occur in a different reaction chamber than that utilized for the steam treatment. If the annealing and steam treatment are conducted in the same reaction chamber, then the annealing can follow directly after the steam treatment (in other words, without breaking a seal to the chamber). In some embodiments, an atmosphere within the chamber can be switched from the steam conditions to an inert gas without cooling construction 10, and then the temperature of the construction can be ramped from the steam treatment temperature to the maximum annealing temperature.

If the annealing and steam treatment are conducted in different reaction chambers from one another, than the silicon oxide formed by the steam treatment (oxide 48 of FIG. 6) may be cooled to room temperature prior to initiation of the temperature ramp utilized for the annealing; or, in other embodiments, may be subjected to the annealing without first cooling the construction to room temperature.

Figure 8:
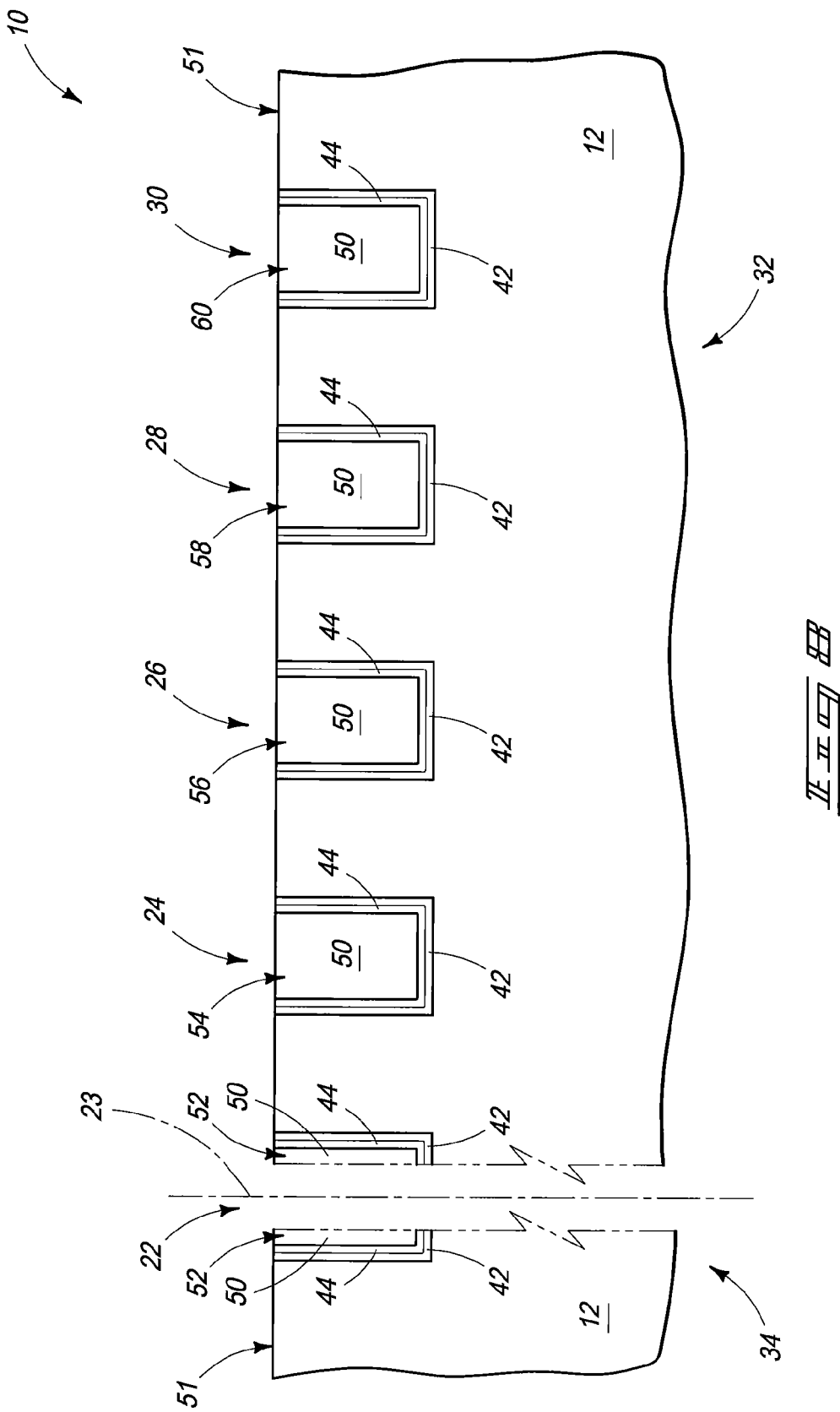
FIGS. 8 and 9 illustrate alternative processing steps that may follow the processing step of FIG. 7.

In embodiments in which the layers 18 and 20 are a pad layer and a hard mask, respectively, such layers may be removed from over semiconductor material 12 with planarization. For instance, FIG. 8 shows construction 10 after the construction has been subjected to planarization (for instance, chemical-mechanical polishing) to remove material 50, layer 18 and layer 20 from over semiconductor material 12, and to form a planarized upper surface 51 extending across semiconductor material 12, and the oxides 42, 44 and 50 within openings 22, 24, 26, 28 and 30. The oxides 42, 44 and 50 form a plurality of isolation structures 52, 54, 56, 58 and 60 within the openings 22, 24, 26, 28 and 30, respectively. Such isolation structures may correspond to shallow trench isolation (STI) in some embodiments. The isolation structures 52, 54, 56, 58 and 60 contain no silicon nitride between oxide 50 and semiconductor material 12, which can avoid some of the problems discussed above regarding silicon nitride barrier layers.

As mentioned above, either or both of oxides 42 and 44 may be optional, and accordingly some embodiments comprise isolation structures containing oxide 50 either alone, or in combination with only one of the shown oxides 42 and 44.

Figure 9:
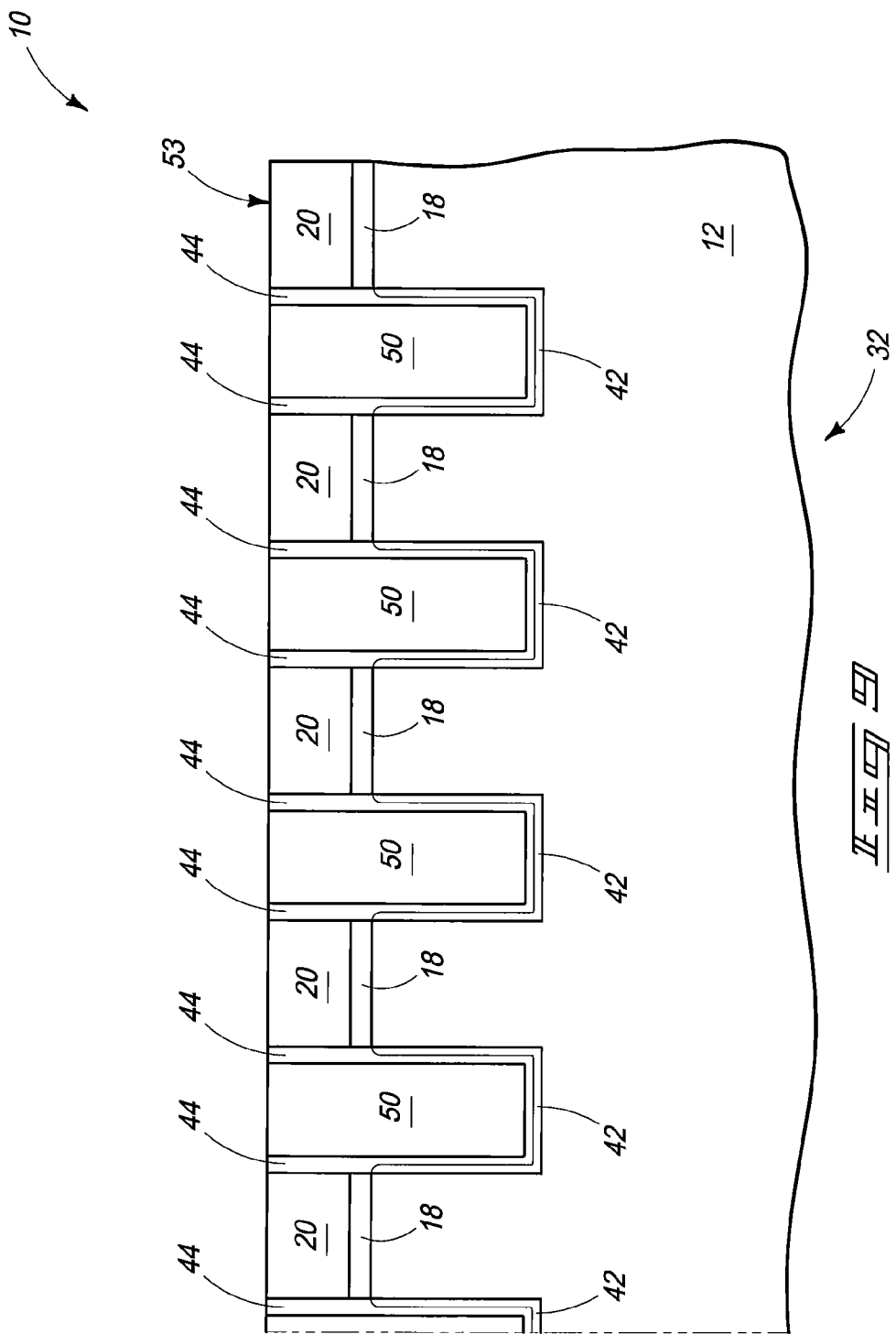

In embodiments in which layers 18 and 20 (FIG. 7) comprise tunnel dielectric material and floating gate material, respectively, planarization may be used to remove materials 44 and 50 from over layer 20, while leaving the layers 18 and 20 remaining over construction 10; and thus to form a construction of the type shown in FIG. 9. The construction of FIG. 9 has a planarized upper surface 53 extending across materials 20, 44 and 50. Only the memory array region 32 is shown in FIG. 9 (rather than also showing the peripheral region 34 (FIG. 7)), in order to simplify the drawing.

Figure 10:
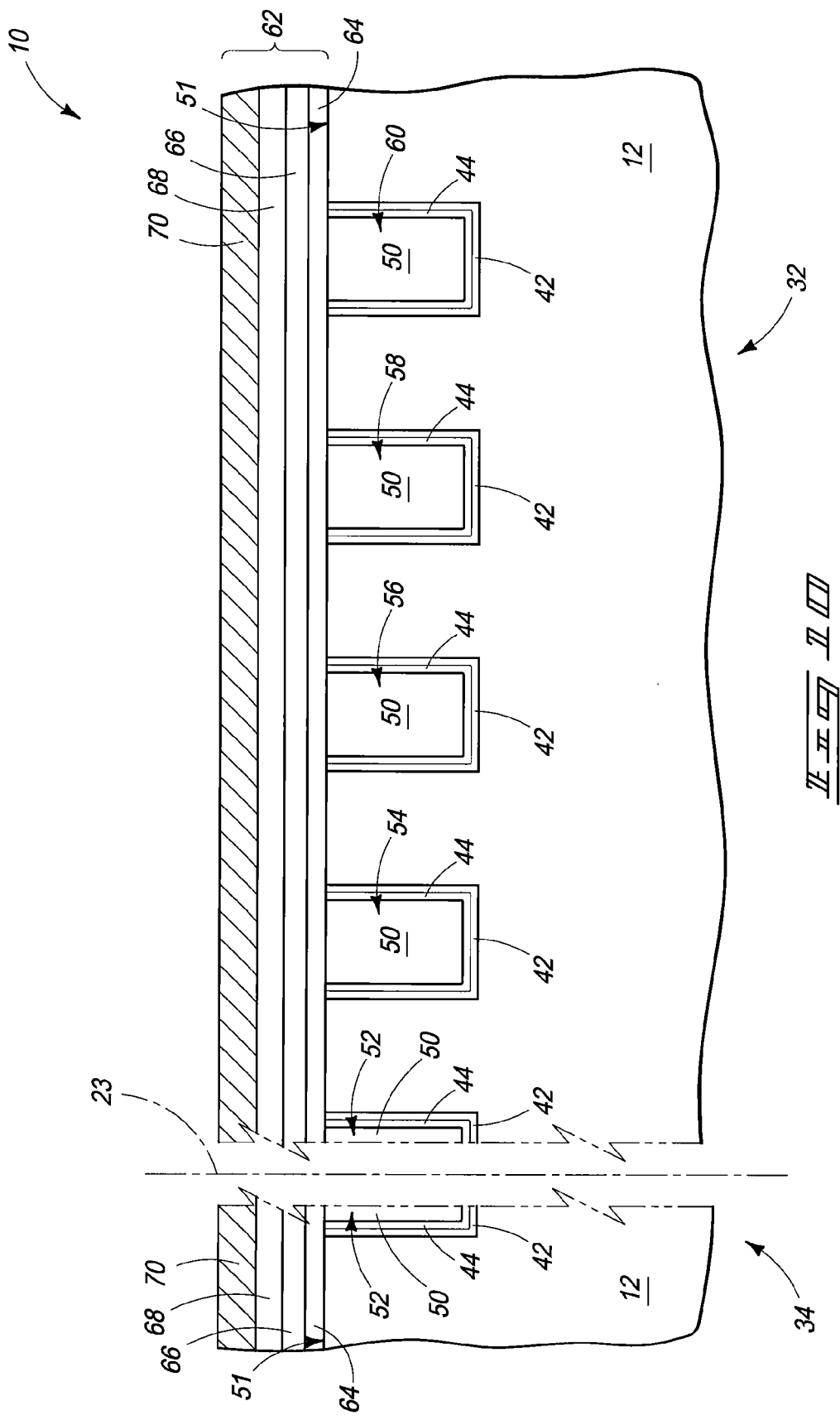
FIG. 10 illustrates an example processing step that may follow the processing step of FIG. 8.

The constructions of FIGS. 8 and 9 may be subjected to subsequent processing to form nonvolatile memory. FIG. 10 shows a nonvolatile memory gate stack formed relative to the construction of FIG. 8, and FIG. 11 shows nonvolatile memory gates formed relative to the construction of FIG. 9.

Referring to FIG. 10, a memory gate stack 62 is formed over planarized upper surface 51. The memory gate stack comprises tunnel dielectric 64, charge storage material 66, dielectric material 68, and control gate material 70. The tunnel dielectric 64 may comprise any suitable composition, and in some embodiments may comprise, consist essentially of, or consist of silicon dioxide. The charge storage material 66 may comprise any suitable composition. In some embodiments, the charge storage material may comprise polycrystalline silicon (in other words, may comprise a floating gate material). In other embodiments, the charge storage material may comprise charge trapping material, such as, for example, silicon nitride and/or nanoparticles. The dielectric material 68 may comprise any suitable composition, and in some embodiments may comprise one or more of silicon dioxide, hafnium oxide and zirconium oxide. The control gate material 70 may comprise any suitable composition, and in some embodiments may comprise one or more of various metals, metal-containing compounds, and conductively-doped semiconductor materials.

Figure 11:
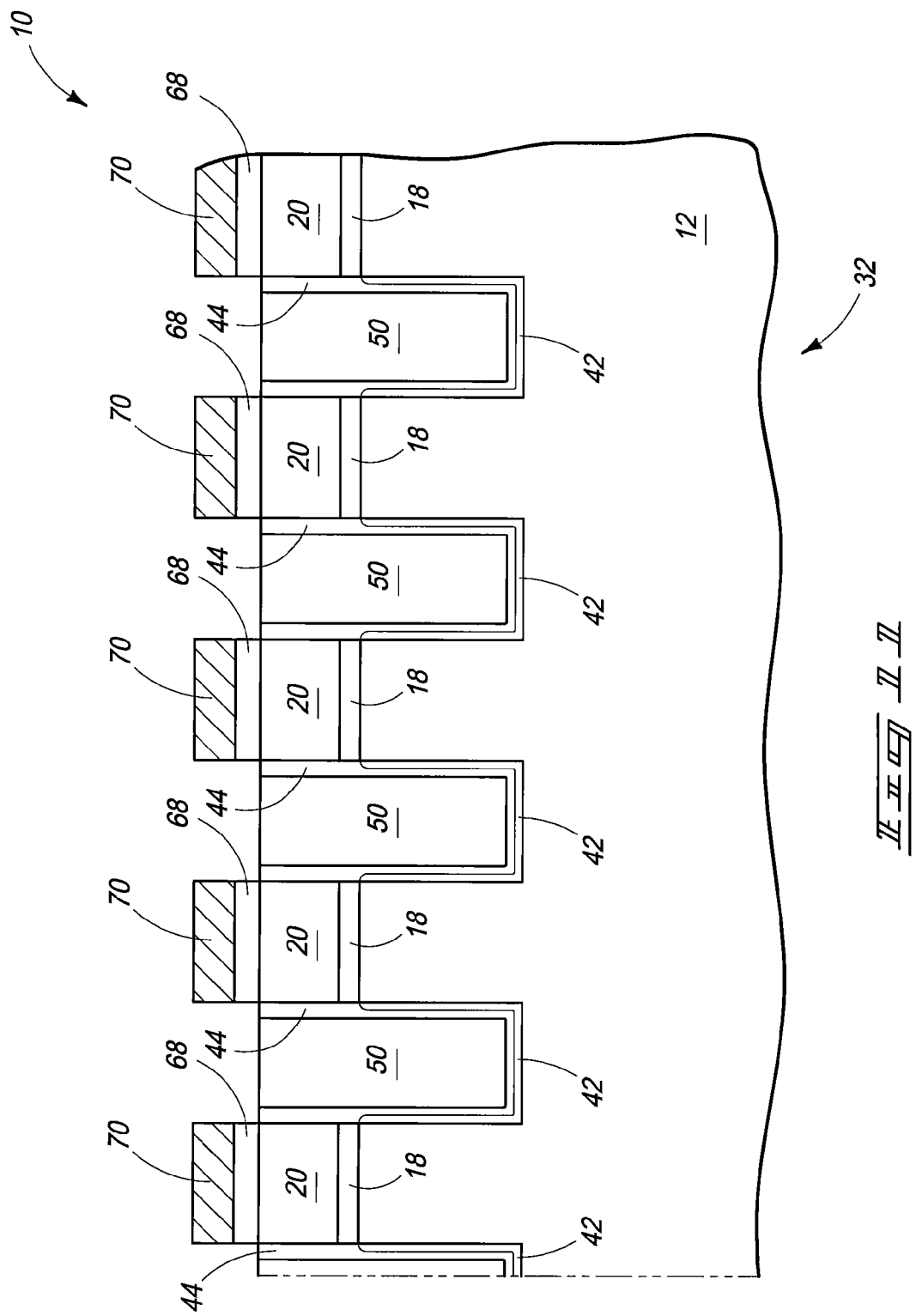
FIG. 11 illustrates an example processing step that may follow the processing step of FIG. 9.

FIG. 11 shows a processing stage following that of FIG. 9 in an embodiment in which layer 18 comprises tunnel dielectric material, and in which layer 20 comprises floating gate material. Dielectric material 68 and control gate material 70 are formed over floating gate material of layer 20 to form a plurality of nonvolatile memory gates. The dielectric material 68 and control gate material 70 of FIG. 11 may be formed in lines that extend in and out of the page relative to the cross-sectional view of FIG. 11.

The nonvolatile memory gates of FIG. 11 may be incorporated into nonvolatile memory devices that are isolated from one another by isolation structures comprising densified oxide 50. Similarly, the gate stack 62 of FIG. 10 may be subsequently patterned to form a plurality of gates for nonvolatile memory devices (for instance, gates of NAND devices) over memory array region 32, with at least some of such gates being electrically isolated from one another by the isolation structures 54, 56, 58 and 60.

Figure 12:
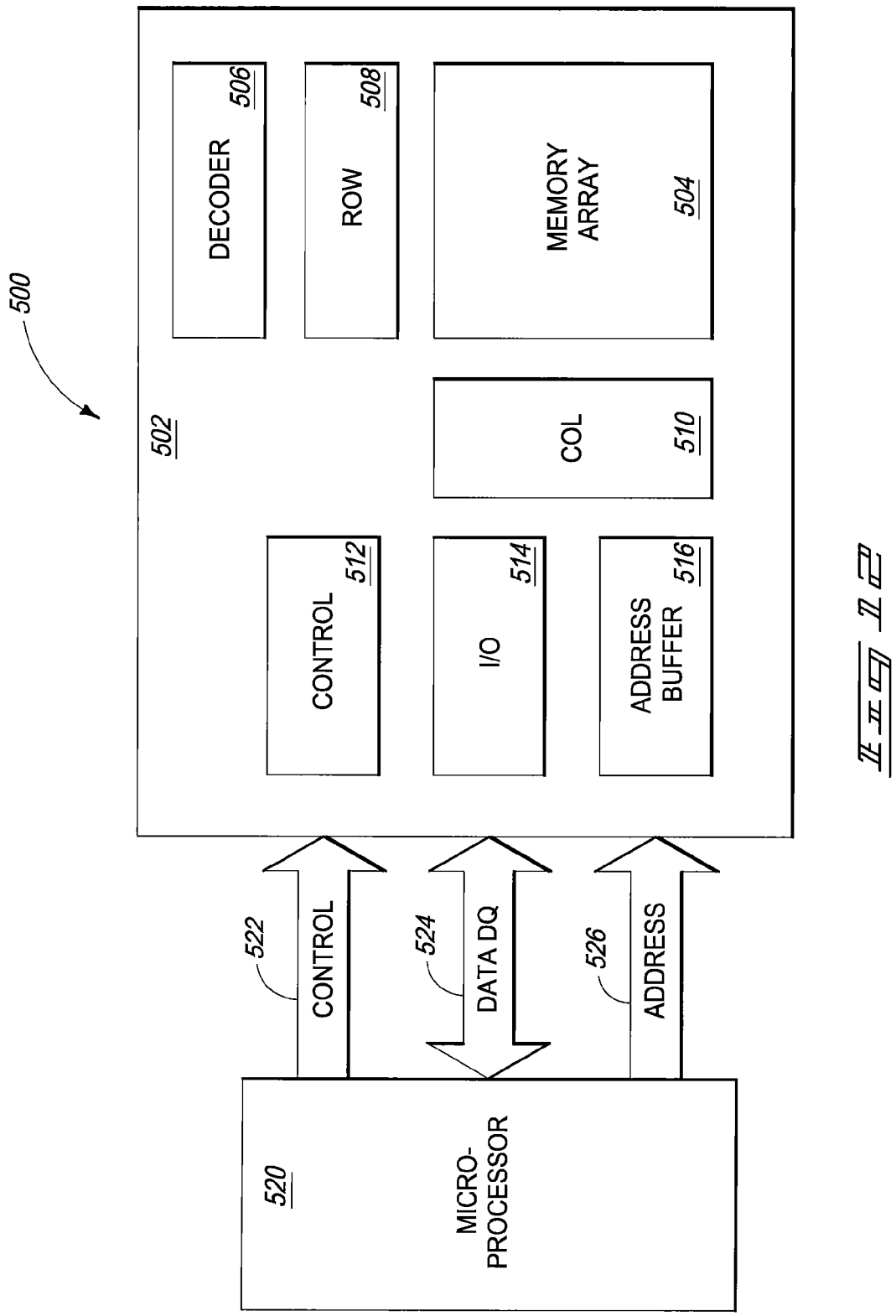
FIG. 12 is a simplified block diagram of a memory system in accordance with an embodiment.

In some embodiments, the nonvolatile memory gates formed with the various processing steps of FIGS. 1-11 may correspond to string gates and/or select gates. FIGS. 12 and 13 describe example configurations and applications of nonvolatile memory devices.

FIG. 12 is a simplified block diagram of a memory system 500. The memory system includes an integrated circuit flash memory device 502 (e.g., a NAND memory device), that includes an array of memory cells 504, an address decoder 506, row access circuitry 508, column access circuitry 510, control circuitry 512, input/output (I/O) circuitry 514, and an address buffer 516. Memory system 500 also includes an external microprocessor 520, or other memory controller, electrically connected to memory device 502 for memory accessing as part of an electronic system. The memory device 502 receives control signals from the processor 520 over a control link 522. The memory cells are used to store data that is accessed via a data (DQ) link 524. Address signals are received via an address link 526, and are decoded at address decoder 506 to access the memory array 504. Address buffer circuit 516 latches the address signals. The memory cells may be accessed in response to the control signals and the address signals.

FIG. 13 is a schematic of an array 200 of memory cells. Such may be a portion of memory array 504 of FIG. 10, and may correspond to a NAND array of memory cells. Memory array 200 includes access lines, such as wordlines $202_1$ to $202_N$, and intersecting local datalines, such as bitlines $204_1$ to $204_M$. The number of wordlines 202 and the number of bitlines 204 may be each some power of two, for example, 256 wordlines and 4,096 bitlines. The local bitlines 204 may be coupled to global bitlines (not shown) in a many-to-one relationship.

Memory array 200 includes strings $206_1$ to $206_M$. Each string includes nonvolatile charge-storage transistors $208_1$ to $208_N$. The charge-storage transistors may use floating gate material to store charge, or may use charge-trapping material (such as, for example, metallic nanodots) to store charge.

The charge-storage transistors 208 are located at intersections of wordlines 202 and local bitlines 204. The charge-storage transistors 208 of each string 206 are connected in series source to drain between a source select gate 210 and a drain select gate 212. Each source select gate 210 is controlled by a source select line 214, while each drain select gate 212 is controlled by a drain select line 215.

A source of each source select gate 210 is connected to a common source line 216. The drain of each source select gate 210 is connected to the source of the first charge-storage transistor 208 of the corresponding string 206. For example, the drain of source select gate $210_1$ is connected to the source of charge-storage transistor $208_1$ of the corresponding string $206_1$. The source select gates 210 are connected to source select line 214.

The drain of each drain select gate 212 is connected to a local bitline 204 for the corresponding string at a drain contact 228. For example, the drain of drain select gate $212_1$ is connected to the local bitline $204_1$ for the corresponding string $206_1$ at drain contact $228_1$. The source of each drain select gate 212 is connected to the drain of the last charge-storage transistor 208 of the corresponding string 206. For example, the source of drain select gate $212_1$ is connected to the drain of charge-storage transistor $208_N$ of the corresponding string $206_1$.

Charge-storage transistors 208 include a source 230, a drain 232, a charge storage node 234, and a control gate 236. Charge-storage transistors 208 have their control gates 236 coupled to a wordline 202. A column of the charge-storage transistors 208 are those transistors within a string 206 that are coupled to a given local bitline 204. A row of the charge-storage transistors 208 are those transistors commonly coupled to a given wordline 202.

The embodiments discussed above may be utilized in electronic systems, such as, for example, computers, cars, airplanes, clocks, cellular phones, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a plurality of isolation structures, comprising:
    forming a patterned mask over a semiconductor material; the mask defining a plurality of openings;
    extending the openings into the semiconductor material, each of the openings having a periphery along the semiconductor material;
    providing a polysilazane within the openings, there being no silicon nitride-containing material between the polysilazane and the semiconductor material along the peripheries of the openings;
    exposing the polysilazane to steam while not permitting a temperature of the polysilazane to exceed about 500° C.; the exposure to the steam converting all of the polysilazane to silicon oxide; and
    annealing the silicon oxide under an inert atmosphere; the annealing comprising exposure of the silicon oxide to a temperature gradient having only temperature changes of less than or equal to about 10° C./minute to ramp a temperature of the silicon oxide up to a maximum annealing temperature and down from the maximum annealing temperature; the maximum annealing temperature being at least about 700° C.

2. The method of claim 1 wherein the mask comprises a layer of floating gate material over a layer of tunnel dielectric material.

3. The method of claim 1 wherein the mask comprises a layer of polysilicon over a layer of silicon dioxide.

4. The method of claim 1 wherein the mask comprises a layer of silicon nitride over a layer of silicon dioxide.

5. The method of claim 1 wherein the annealing occurs in a same chamber as the steam exposure.

6. The method of claim 1 wherein the annealing occurs in a different chamber than the steam exposure.

7. The method of claim 1 wherein the polysilazane is perhydro-polysilazane.

8. The method of claim 1 wherein the exposure to the steam includes exposure of the polysilazane to a temperature gradient having only temperature changes of less than or equal to about 10° C./minute to ramp a temperature of the polysilazane up to a maximum steam treatment temperature.

9. The method of claim 1 further comprising forming a deposition of silicon dioxide along the peripheries of the openings prior to providing the polysilazane within the openings; and wherein the deposition utilizes tetraethylorthosilicate.

10. A method of forming nonvolatile memory, comprising:
    forming a plurality of isolation structures extending into a semiconductor material; the forming of the isolation structures comprising providing polysilazane within trenches in the semiconductor material, exposing the polysilazane to steam while a temperature of the polysilazane does not exceed 500° C. to convert all of the polysilazane to silicon oxide, and annealing the silicon oxide under an inert atmosphere at a temperature of at least about 700° C.; no silicon nitride being between the polysilazane and peripheries of the trenches;
    forming a memory gate stack over the semiconductor material in regions between the openings; the memory gate stack including, in ascending order from the semiconductor material, tunnel dielectric, charge storage material, dielectric material, and control gate material;
    wherein the polysilazane is exposed to steam and to a temperature gradient having only temperature changes of less than or equal to about 10° C./minute to ramp a temperature of the polysilazane up to a maximum steam treatment temperature; and
    wherein the silicon oxide is exposed to a temperature gradient having only temperature changes of less than or equal to about 10° C./minute to ramp a temperature of the silicon oxide up from the steam treatment temperature to a maximum temperature of the anneal.

11. The method of claim 10 wherein the charge storage material is floating gate material.

12. The method of claim 10 wherein:
    the charge storage material is floating gate material; and
    the charge storage material and tunnel dielectric material are together utilized as a mask to define locations of the isolation structures.

13. The method of claim 10 wherein the charge storage material is charge trapping material.

14. The method of claim 10 wherein the polysilazane is perhydro-polysilazane.

15. The method of claim 10 further comprising forming silicon dioxide liners within the trenches prior to providing the polysilazane within the trenches.

16. A method of forming an isolation structure, comprising:

forming an opening extending into a semiconductor material; the opening having a periphery comprising sidewalls and a bottom;

providing a polysilazane within the opening, there being no silicon nitride-containing material between the polysilazane and the periphery of the opening;

exposing the polysilazane to steam while not permitting a temperature of the polysilazane to exceed about 500° C.; the exposure to the steam converting the polysilazane to silicon oxide;

annealing the silicon oxide; the annealing comprising exposure of the silicon oxide to a maximum annealing temperature of at least about 700° C.; and wherein the annealing includes exposure of the silicon oxide to a temperature gradient having only temperature changes of less than or equal to about 10° C./minute to ramp a temperature of the silicon oxide up to the maximum annealing temperature and down from the maximum annealing temperature.

\* \* \* \* \*